(12) United States Patent
Arsovski et al.

(10) Patent No.: US 9,704,575 B1
(45) Date of Patent: Jul. 11, 2017

(54) CONTENT-ADDRESSABLE MEMORY HAVING MULTIPLE REFERENCE MATCHLINES TO REDUCE LATENCY

(71) Applicant: GLOBALFOUNDRIES INC., Grand Cayman (KY)

(72) Inventors: Igor Arsovski, Williston, VT (US); Michael T. Fragano, Essex Junction, VT (US); Robert M. Houle, Williston, VT (US); Thomas M. Maffitt, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/990,125

(22) Filed: Jan. 7, 2016

(51) Int. Cl.
*G11C 7/00* (2006.01)
*G11C 15/04* (2006.01)

(52) U.S. Cl.
CPC .................................. *G11C 15/04* (2013.01)

(58) Field of Classification Search
None
See application file for complete search history.

(56) References Cited

U.S. PATENT DOCUMENTS

| | | | |
|---|---|---|---|
| 6,069,815 A | 5/2000 | Mueller et al. | |
| 6,987,682 B2 | 1/2006 | Ma et al. | |
| 6,990,001 B2 | 1/2006 | Ma et al. | |
| 6,999,331 B2 | 2/2006 | Huang | |
| 7,095,640 B2 | 8/2006 | Ma et al. | |
| 7,298,637 B2 | 11/2007 | Ma et al. | |
| 7,372,713 B2 | 5/2008 | Kuliyampattil et al. | |
| 7,751,218 B2 | 7/2010 | Arsovski | |
| 8,913,412 B1 | 12/2014 | Khanna et al. | |
| 2003/0112684 A1 | 6/2003 | Barth, Jr. | |
| 2007/0217244 A1 | 9/2007 | Narayanaswamy et al. | |
| 2007/0247885 A1* | 10/2007 | Watanabe | G11C 15/04 365/49.17 |
| 2008/0239778 A1* | 10/2008 | Shastry | G11C 15/04 365/49.17 |
| 2011/0216569 A1* | 9/2011 | Akiyama | G11C 15/00 365/49.17 |
| 2015/0055389 A1 | 2/2015 | Arsovski et al. | |

* cited by examiner

*Primary Examiner* — Harry W Byrne
*Assistant Examiner* — Sultana Begum
(74) *Attorney, Agent, or Firm* — Gibb & Riley, LLC; Anthony J. Canale

(57) ABSTRACT

Words of data are maintained in content-addressable memory cells arranged in rows. Two of the rows are timing reference rows, and the remainder of the rows are data rows that maintain the words of data. The data rows form individual matchlines. A first of the reference rows forms a precharge reference matchline, and a second of the reference rows forms an evaluation reference matchline. The timing for the individual matchlines to precharge is based on the time to precharge the precharge reference matchline, and timing for the individual matchlines to evaluate a search word is based on the time for the evaluation reference matchline to evaluate the search word.

16 Claims, 4 Drawing Sheets

CONTENT-ADDRESSABLE MEMORY HAVING MULTIPLE REFERENCE MATCHLINES TO REDUCE LATENCY

BACKGROUND

The present disclosure relates to content-addressable memory, and more specifically, to using multiple dummy reference matchlines to reduce latency.

Content-addressable memory (CAM) compares input search data against a table of stored data, and returns the address of the matching data. CAMs have a single clock cycle throughput making them faster than other hardware-based and software-based search systems. The input to the system is the search word that is broadcast onto the searchlines to the table of stored data. Each stored word has a matchline that indicates whether the search word and stored word are identical (the match case) or are different (a mismatch case, or miss). In addition, there is often a hit signal that flags in the case where there is no matching location in the CAM.

SUMMARY

Exemplary integrated circuit devices herein can be, for example, content-addressable memory devices and can include content-addressable memory cells arranged in rows. Two of the rows are timing reference rows and the remainder of the rows are data rows maintaining words of data. The data rows form individual matchlines, a first of the reference rows forms a precharge reference matchline, and a second of the reference rows forms an evaluation reference matchline. First-type of sense amplifiers are directly or indirectly connected to the individual matchlines and the evaluation reference matchline. A second-type of sense amplifier, different from the first-type of sense amplifiers, is directly or indirectly connected to the precharge reference matchline. The timing (allowed time) for the individual matchlines to precharge is based on the time taken to precharge the precharge reference matchline; and the timing (allowed time) for the individual matchlines to evaluate a search word is based on the time taken for the evaluation reference matchline to evaluate the search word.

Such devices further include searchlines intersecting the data rows, and the searchlines evaluate search words by broadcasting the search words to the data rows. Each of the rows maintains a single word of data. In operation, a location within the content-addressable memory cells is output in response to the search word being matched to the words of data during evaluation of the individual matchlines. The precharge reference matchline is hardwired to have all bits produce a match to determine the maximum (worst-case) time taken to precharge the precharge reference matchline. The evaluation reference matchline is hardwired to a one-bit-miss word (that has only one bit not producing a match) to determine the maximum (worst-case) time taken to evaluate the evaluation reference matchline.

Additionally, a controller is directly or indirectly connected to the individual matchlines, the precharge reference matchline, and the evaluation reference matchline. The controller determines when a precharging operation of the individual matchlines is completed based upon a precharging operation being completed within the precharge reference matchline (again, the precharge reference matchline is hardwired to a match on all bits). The controller determines when an evaluation operation of the individual matchlines is completed based upon an evaluation operation being completed within the evaluation reference matchline (again, the evaluation reference matchline is hardwired to a one-bit-miss word).

The time to precharge the precharge reference matchline, and the time to evaluate the evaluation reference matchline are not fixed times, but are variable times based upon processing conditions including voltage, temperature, material make up of the integrated circuit device, resistance and size of the integrated circuit device, etc.

Various methods herein maintain words of data in content-addressable memory cells arranged in rows, two of the rows are timing reference rows and the remainder of the rows are data rows that maintain the words of data. The data rows form individual matchlines, a first of the reference rows forms a precharge reference matchline, and a second of the reference rows forms an evaluation reference matchline.

With such methods the precharge reference matchline is hardwired to have all bits produce a match to determine the maximum (worst-case) timing for the individual matchlines to precharge (e.g., based on the time taken to precharge the precharge reference matchline). Thus, the process of determining timing for the individual matchlines to precharge is performed by determining when a precharging operation of the individual matchlines is completed based upon a precharging operation being completed within the precharge reference matchline, using a controller connected to the individual matchlines, the precharge reference matchline, and the evaluation reference matchline.

Also, with such methods, the evaluation reference matchline is hardwired to a one-bit-miss word (that has only one bit not producing a match) to determine the maximum (worst-case) timing for the individual matchlines to evaluate a search word (e.g., based on the time taken for the evaluation reference matchline to evaluate the one-bit-miss word). The process of evaluating the search word includes broadcasting the search words to the data rows using searchlines intersecting the data rows (where each searchline intersects the same bit of each matchline). Thus, process of determining timing for the individual matchlines to evaluate a search word is performed by determining when an evaluation operation of the individual matchlines is completed based upon an evaluation operation being completed within the evaluation reference matchline, using the controller.

The time to precharge the precharge reference matchline and the time to evaluate the evaluation reference matchline are not fixed times, but are variable times based upon processing conditions including voltage, temperature, material make up of the content-addressable memory cells, and the resistance and size of the content-addressable memory cells, etc.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
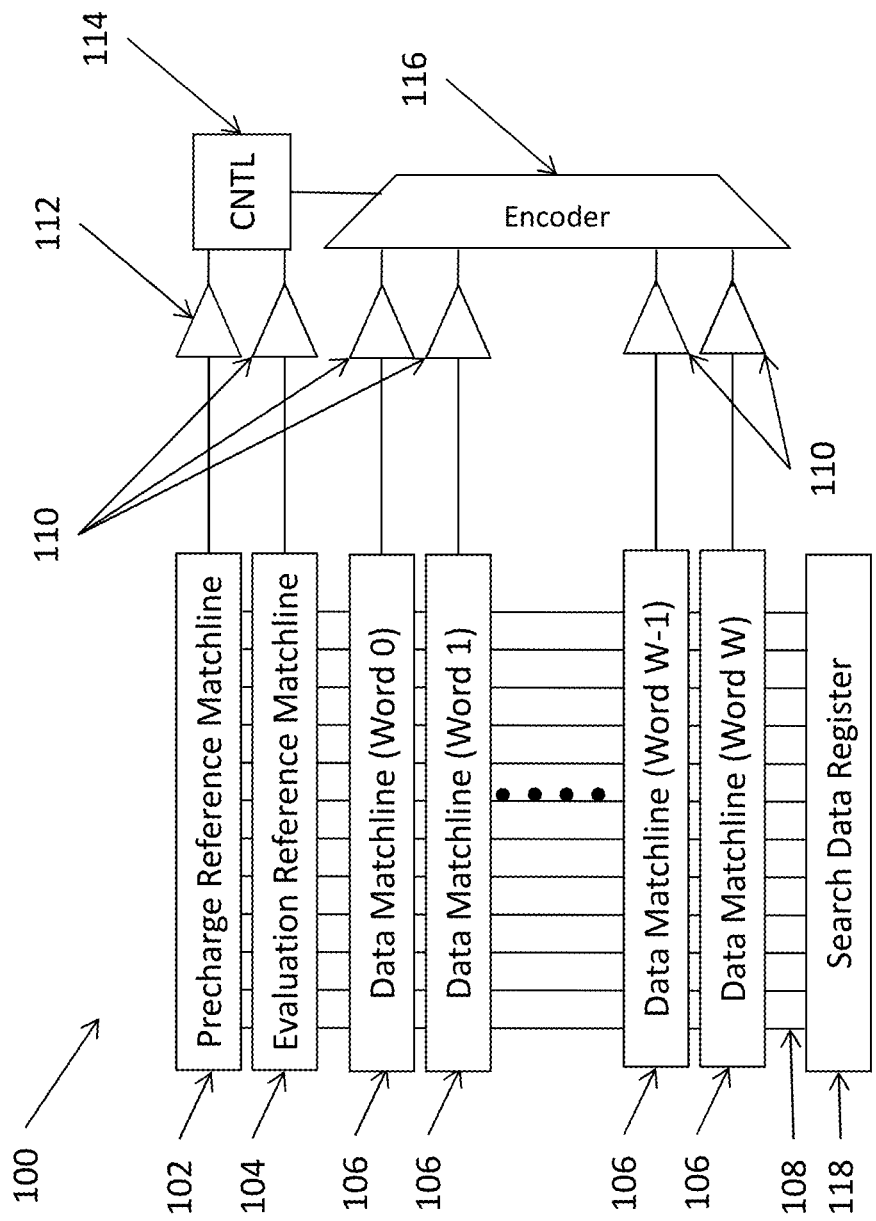
FIG. 1 is a schematic diagram of a content addressable memory according to embodiments herein.

The basic process for sensing the state of matchlines (ML) in content-addressable memory (CAM) integrated circuit devices is first to precharge high the matchline and then evaluate by allowing the cells to pull down the matchlines in the case of a miss, or leave the matchline high in the case of a match. Thus, signal timing can be divided into three phases: searchline (SL) precharge, ML precharge, and ML evaluation. The operation begins by precharging the searchlines low, and then precharging the matchline high. Once the matchline is high, the ML evaluation phase begins by placing the search word on the searchlines. If there is at least one single-bit miss on a matchline, a path (or multiple paths) to ground will discharge that matchline, indicating a miss for the entire word, which is output on the matchline sense amplifier (MLSA) sense-output node. If all bits on the matchline match, the matchline will remain high indicating a match for the entire word.

Self-referencing sensing devices do not precharge all sense amplifiers to the same voltage level. Instead, in order to reduce the timing uncertainty, self-referencing systems allow each individual sense amplifier to precharge the corresponding matchline to a unique voltage level that is relative to the sense amplifier's unique trip point. This eliminates the timing and uncertainty caused by local device variations. This reliably reduces the voltage difference between the precharge voltage and the sense voltage of the sense amplifier to reduce signal development time, and this eliminates the timing and uncertainty caused by local device variations. Also, the time to evaluate the matchline depends on the matchline capacitance and the matchline pulldown resistance. The worst-case matchline pulldown resistance occurs when only a single bit misses, activating only a single pulldown path.

Additional reference (e.g., dummy) matchlines can be added to a content addressable memory in order to provide examples of how long it takes to perform the precharge and evaluation operations. Such reference matchlines do not contain matchable data words (do not store words to which a search can result in a match) and, therefore, such reference matchlines are sometimes referred to as "redundant" or "dummy" matchlines.

Structures may utilize a fixed logic delay that has the same length, loading, and metal insensitivity as the matchline. When the "data sense amp" is used with a single reference matchline for both precharge and evaluation, the precharge tracking is too fast. This occurs because, during precharge, the high impedance of the sense amplifier precharge path causes the sense amp output to flip before the precharge of the matchline is complete. This tracking can be improved by increasing the size of some sense amplifier devices, but at the cost of area performance. A better solution is to use a separate "custom" precharge reference matchline and evaluation reference matchline for precharge and evaluation tracking.

One downside of logic that provides fixed times for precharging and evaluation of content addressable memories is that the fixed times need to be set for the worst-case machine and environmental conditions (e.g., voltage, temperature, material make up of the integrated circuit device, size (length) and resistance of the matchline, etc.); when, in fact, many content addressable memories could operate very effectively with shorter precharging and evaluations times.

These overly pessimistic fixed times for precharging and evaluation of content addressable memories unnecessarily slow such devices because many environments (and many designs) could allow such devices to properly operate with shorter delays (which would allow such devices to operate faster). For example, short matchlines typically see a large performance penalty because of a fixed logic delay, and they also incur a power/noise penalty associated with an over-bounded matchline precharge pulse. Therefore, if a fixed logic delay block that is not sensitive to matchline length or metal resistance/capacitance (RC) parameters is used to set the precharge time, the consequence is an over estimation of precharge time, resulting in a longer than necessary cycle time for short matchlines and low RC metals.

In view of this, as shown in FIG. 1, the devices (and methods) herein add a precharge reference matchline 102 that emulates a full match and a corresponding sense amplifier 112 that samples the voltage of the precharge reference matchline, giving a more realistic (worst-case) view of the matchline precharge level. A separate evaluation reference matchline 104 is initiated to one bit miss, creating a worst-case timing for evaluation only. This improves cycle time for varying process conditions and architectures verses a fixed logic delay for precharge time of the prior art that cannot flexibly allow the device to operate faster under varying process conditions and architectures.

Therefore, to improve the precharge time for varying matchline lengths and process sensitivity, the devices herein include a sensing architecture that has two separate reference matchlines (one for precharge, and one for evaluation). The precharge reference matchline is initiated as a full match and samples the voltage at the matchline, giving a more realistic view of the matchline precharge level. The precharge reference matchline is over precharged to assure the cycle completes for all process conditions. A separate evaluation reference matchline is initiated to one bit miss creating a worst-case timing for evaluation only. As a consequence, the result and value is a cycle time improvement for varying process conditions and architectures verses the fixed delay for precharge of the prior art.

Referring again to FIG. 1, exemplary integrated circuit devices herein can be, for example, content-addressable memory devices 100 and can include content-addressable memory cells arranged in rows (102, 104, 106). Two of the rows (102 and 104) are timing reference rows and the remainder of the rows are data rows 106 maintaining words of data. The data rows form (or are) individual matchlines 106, a first of the reference rows forms (or is) a precharge reference matchline 102, and a second of the reference rows forms (or is) an evaluation reference matchline 104.

First-type of sense amplifiers 110 are directly or indirectly connected to the individual matchlines 106 and the evaluation reference matchline 104. A second-type of sense amplifier 112, different from the first-type of sense amplifiers, is directly or indirectly connected to the precharge reference matchline 102. These amplifiers are shown in greater detail in FIGS. 2 and 3 and provide an output to the encoder 116.

The timing (time allowed) for the individual matchlines 106 to precharge is based on the time to precharge the precharge reference matchline 102; and the timing (time allowed) for the individual matchlines 106 to evaluate a search word is based on the time taken for the evaluation reference matchline 104 to evaluate the search word. Such devices further include searchlines 108 intersecting the data rows (and a corresponding search data register 118) and the searchlines 108 evaluate search words by broadcasting the search words to the data rows 102, 104, 106. Each of the rows 102, 104, 106 maintains a single multi-bit word of data, and each searchline 108 intersects the same data bit of each word in the matchlines 102, 104, 106.

In operation, a location within the content-addressable memory data cells 106 is output in response to the search word being matched to the words of data during evaluation of the individual matchlines 106. The precharge reference matchline 102 is hardwired to have all bits produce a match to determine the maximum (worst-case) time to precharge the precharge reference matchline 102. The evaluation reference matchline 104 is prewired to a one-bit-miss word that has only one bit not producing a match to determine the maximum (worst-case) time to evaluate the evaluation reference matchline 104.

Additionally, a controller 114 is directly or indirectly connected to the individual matchlines 106, the precharge reference matchline 102, and the evaluation reference matchline 104. The controller 114 determines when a precharging operation of the individual matchlines 106 is completed based upon a precharging operation being completed within the precharge reference matchline 102 (again, the precharge reference matchline 102 is hardwired to have all bits produce a match). The controller 114 determines when an evaluation operation of the individual matchlines 106 is completed based upon an evaluation operation being completed within the evaluation reference matchline 104.

As noted above, the evaluation reference matchline 104 is hardwired to a one-bit-miss word. This is shown, for example, in FIG. 2 where the far cell 152 on the evaluation reference matchline 104 has its searchline and SRAM cell connections tied to relatively high voltage, while the remaining cells 154 are connected to ground, creating a one bit miss every search cycle regardless of the state of the searchlines. The changing state of all the other searchlines affects the evaluation reference matchline capacitive load. Consequently, the evaluation timing better tracks the data matchline load.

Figure 2:
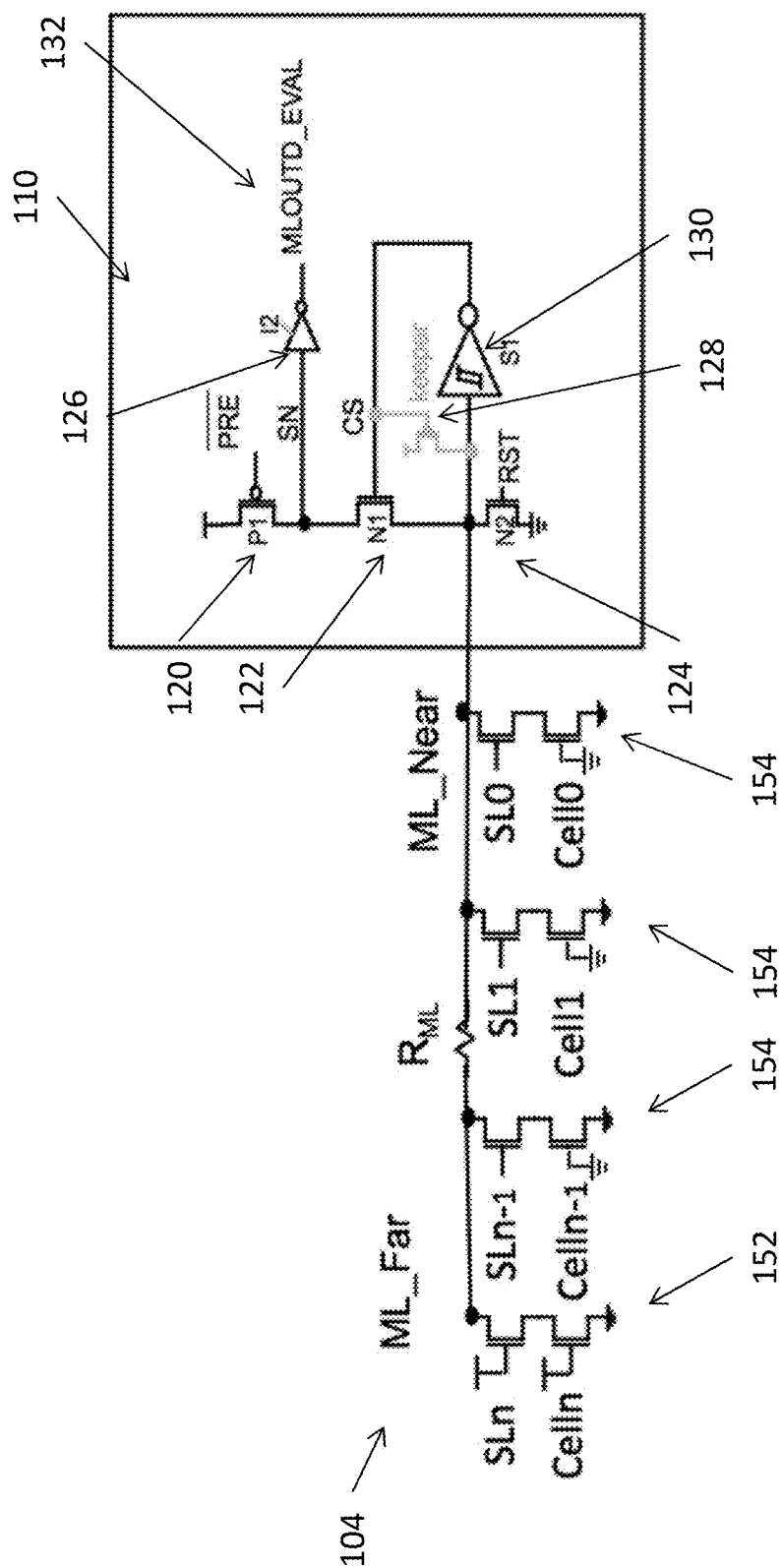
FIG. 2 is a schematic diagram of a sense amplifier and matchline according to embodiments herein.
Figure 3:
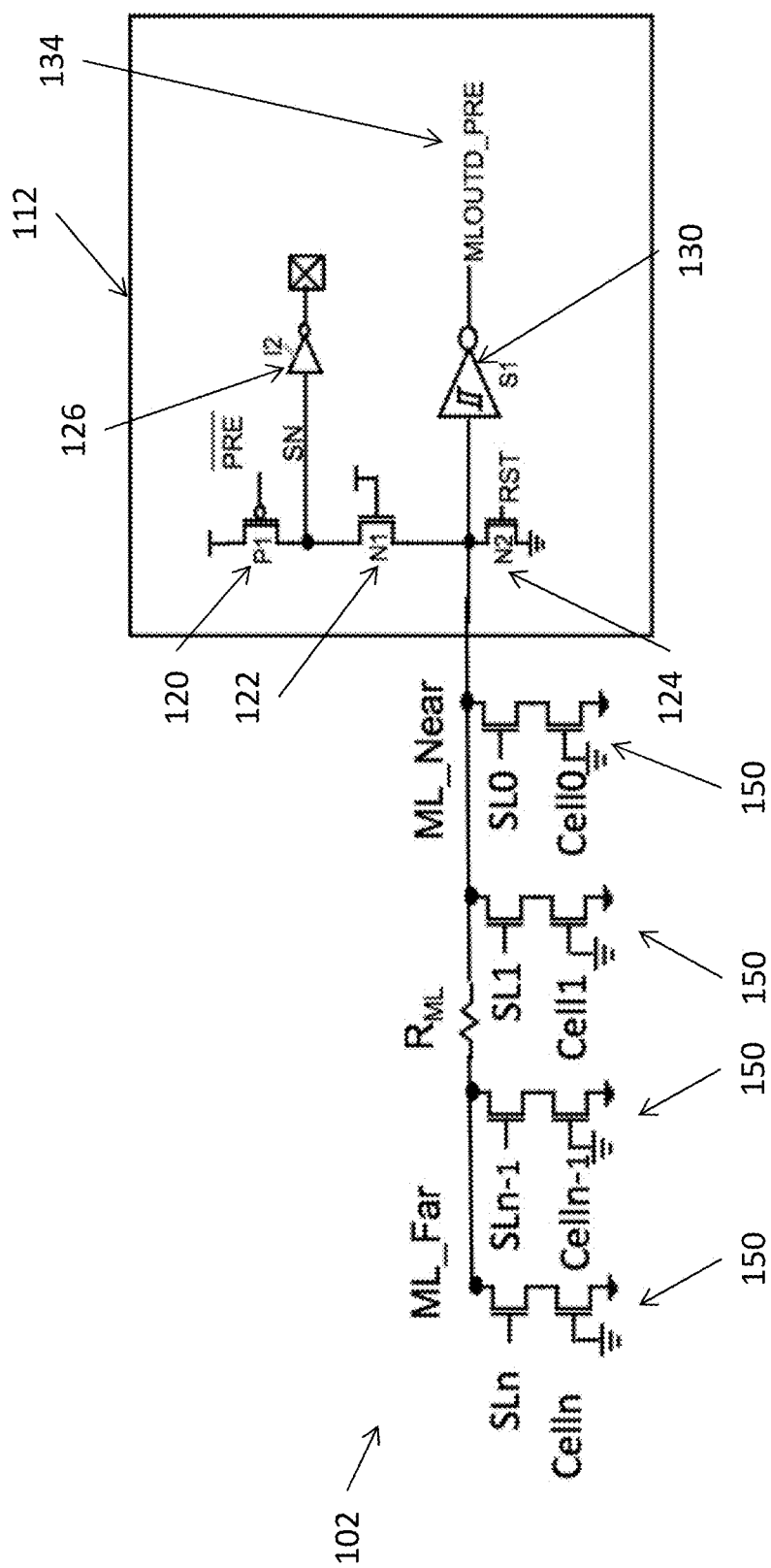
FIG. 3 is a schematic diagram of a sense amplifier and matchline according to embodiments herein.

The sense amplifiers 110 used with the evaluation reference matchline 104 and the data matchlines 106 is shown schematically in FIG. 2. More specifically, FIG. 2 shows a first transistor 120 (P1) that is connected to the precharge voltage (PRE) and to a second transistor 122 (N1), which in turn is connected to a grounded transistor 124 (N2). A keeper circuit 128 and inverter 130 are connected to the second transistor 122 and the grounded transistor 124. The search cycle begins with $\overline{PRE}$ going to a relatively low voltage level (e.g., ground). The voltage on line SN rises and the matchline begins to precharge via 122 (N1). Precharging ends when the voltage on MLOUTD_PRE 134 falls, indicating the precharge reference matchline 102 is precharged (FIG. 3). By operation of the CNTL block 114 shown in FIG. 1, the voltage on $\overline{PRE}$ rises, ending the precharge process. The voltage of the evaluation reference matchline 104 (one bit miss) falls, causing S1 (130) to switch CS from a relatively low voltage to a relatively high voltage (see FIG. 2), and SN follows the discharging matchline, causing inverter I2 (126) to switch and MLOUTD_EVAL 132 to go to a relatively high voltage level, indicting a miss has occurred on the evaluation reference matchline 104. By operation of the CNTL block 114 shown in FIG. 1, the voltage on MLOUTD_EVAL 132 causes RST (124 (N2)) to rise, pulling the matchline to ground, and ending the search cycle.

The evaluation reference ML is initiated to one bit miss, and samples the voltage after the N1 device 122 (at SN), giving a more realistic view for evaluation. Therefore, because the sense amplifier 110 used with the evaluation reference matchline 104 is initiated to one bit miss, it performs the slowest possible pull down to ground operation, and this represents the longest timing parameter (maximum evaluation timing) for an evaluation process that could be performed by the content addressable memory 100.

As noted above, the precharge reference matchline 102 is hardwired to have all bits produce a match. This is shown in FIG. 3 where all precharge reference matchline cells are connected to produce a match. Specifically, all bottom matchline devices 150 are disconnected from the SRAM cell and connected to ground. This creates a match for all search cycles regardless of the state of the searchlines. However, the changing state of the searchlines affects the precharge reference matchline capacitive load. Consequently, the precharge timing better tracks with the data matchline load.

The precharge reference matchline 102 uses a different sense amplifier 112 that is shown in FIG. 3. The different configuration of the sense amplifier 112 shown in FIG. 3 illustrates that the inverter 126 does not produce any output and, instead the second transistor 122 is connected to the precharge voltage, and the inverter 130 provides the output 134 that only indicates that the sense amplifier 112 has been pre-charged. Therefore, the sense amplifier 112 is only concerned with precharging, and is incapable of indicating whether a data match or miss is present (because there is no output from inverter 126). The precharge reference matchline 102 is initiated as a full match (no misses) and samples the voltage before the N1 device 122, giving a more realistic view of the matchline precharge level (note the CS node of transistor 122 is connected high to maximize matchline swing and over precharges the sense amplifier 112). Thus, by providing output 134 that indicates when the sense amplifier 112 is fully precharged for a full match (no misses) data word, this measures the maximum, worst-case amount of precharge time (the longest possible precharge operation) that could be performed by the content addressable memory 100; and the controller 114 uses this as the precharge time for the entire content addressable memory to ensure that all matchlines and sense amplifiers are fully precharged.

Also, both reference matchlines 102, 104 "see" the same load as the data matchlines 106 since they are connected to the same selectlines (SL) 108. In the ternary CAM (TCAM) cell, an NFET is connected to the matchline and gated by the selectline. A second transistor device is in series to ground, with its gate connected to one side of the 6 device static random access memory (SRAM) cell that completes the 8 device TCAM cell. All the cells on the precharge reference matchline have the bottom NFET gate grounded by design. The evaluation reference matchline has a single cell where both devices in series from matchline to ground are "hardwired on" by design. In this way the precharge and evaluation reference matchlines track the load of the data matchlines as modulated by changing selectline states, but are always a match for the precharge reference matchlines, and a single miss for the evaluation reference matchline.

The time to precharge the precharge reference matchline 102 and the time to evaluate the evaluation reference matchline 104 are not fixed times and are variable times based upon processing conditions including voltage, temperature, material make up, size (length), resistance, etc., of the integrated circuit device.

As noted above, structures may utilize a fixed logic delay that has the same length, loading, and metal insensitivity as the matchline. When the "data sense amp" is used with a single reference matchline for both precharge and evaluation, the precharge tracking is too fast. This occurs because, during precharge, the high impedance of N1 122 causes SN to rise and flip I2 (126) before the precharge of the matchline is complete. This tracking can be improved by increasing size of N1 122, but at the cost of area and performance. A better solution is shown above that use a separate "custom" precharge reference matchline 102 and evaluation reference matchline 104 for precharge and evaluation tracking.

Figure 4:
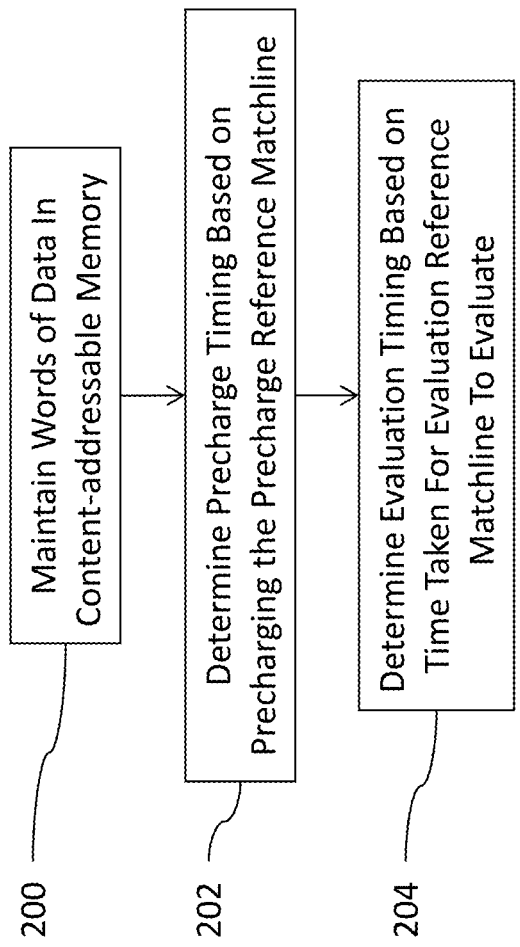
FIG. 4 is a flow diagram illustrating various methods herein.

FIG. 4 is a flow diagram illustrating various methods herein some of which begin in item 200, where such methods maintain words of data in content-addressable memory cells arranged in rows. Two of the rows are timing reference rows, and the remainder of the rows are data rows that maintain the words of data. The data rows form individual matchlines. A first of the reference rows forms a precharge reference matchline, and a second of the reference rows forms an evaluation reference matchline.

In item 202, these methods determine maximum (worst-case) timing for the individual matchlines to precharge, based on the time taken to precharge the precharge reference matchline (again, the precharge reference matchline 102 is hardwired to have all bits produce a match). Thus, the process of determining timing for the individual matchlines to precharge in item 202 is performed by determining when a precharging operation of the individual matchlines is completed, based upon a precharging operation being completed within the precharge reference matchline, using a controller connected to the individual matchlines, the precharge reference matchline, and the evaluation reference matchline.

In item 204, these methods determine maximum (worst-case) timing for the individual matchlines to evaluate a search word based on the time taken for the evaluation reference matchline to evaluate the search word (again, the evaluation reference matchline 104 is hardwired to a one-bit-miss word). The process of evaluating the search word includes broadcasting the search words to the data rows using searchlines intersecting the data rows. Thus, the process of determining timing for the individual matchlines to evaluate a search word in item 204 is performed by determining when an evaluation operation of the individual matchlines is completed based upon an evaluation operation being completed within the evaluation reference matchline, using the controller.

The time to precharge the precharge reference matchline and the time to evaluate the evaluation reference matchline are not fixed times, but are variable times based upon processing conditions including voltage, temperature, material make up of the content addressable memory cells, and size (length) of the content-addressable memory cells.

Such content addressable memories can be included in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise.

In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
    content-addressable memory cells arranged in rows, two of the rows are timing reference rows and the remainder of the rows are data rows maintaining words of data,
    the data rows comprise individual matchlines,
    a first reference row of the reference rows comprises a precharge reference matchline,
    a second reference row of the reference rows comprises an evaluation reference matchline,
    the precharge reference matchline is hardwired to match all bits and timing for the individual matchlines to precharge is based on a time to precharge the precharge reference matchline, and
    the evaluation reference matchline is hardwired to a one-bit-miss word that has only one bit not producing a match and timing for the individual matchlines to evaluate a search word is based on a time for the evaluation reference matchline to evaluate the search word.

2. The device according to claim 1, further comprising a controller connected to the individual matchlines, the precharge reference matchline, and the evaluation reference matchline,
    the controller determines when a precharging operation of the individual matchlines is completed based upon a precharging operation being completed within the precharge reference matchline, and
    the controller determines when an evaluation operation of the individual matchlines is completed based upon an evaluation operation being completed within the evaluation reference matchline.

3. The device according to claim 1, the time to precharge the precharge reference matchline and the time to evaluate the evaluation reference matchline are not fixed times and are variable times based upon processing conditions including voltage, temperature, material make up of the device, size of the device, and resistance of the device.

4. The device according to claim 1, further comprising searchlines intersecting the data rows, the searchlines evaluate search words by broadcasting the search words to the data rows.

5. The device according to claim 1, each of the rows maintains a single one of the words of data.

6. A device comprising:
content-addressable memory cells arranged in rows, two of the rows are timing reference rows and the remainder of the rows are data rows maintaining words of data, the data rows comprise individual matchlines, a first reference row of the reference rows comprises a precharge reference matchline, and a second reference row of the reference rows comprises an evaluation reference matchline;
first-type of sense amplifiers connected to the individual matchlines and the evaluation reference matchline; and
a second-type of sense amplifier, different from the first-type of sense amplifiers, connected to the precharge reference matchline,
the precharge reference matchline is hardwired to match all bits and timing for the individual matchlines to precharge is based on a time to precharge the precharge reference matchline, and
the evaluation reference matchline is hardwired to a one-bit-miss word that has only one bit not producing a match and timing for the individual matchlines to evaluate a search word is based on a time for the evaluation reference matchline to evaluate the search word.

7. The device according to claim 6, a location within the content-addressable memory cells is output in response to the search word being matched to the words of data during evaluation of the individual matchlines.

8. The device according to claim 6, a location within the content-addressable memory cells is output in response to the search word being matched to the words of data during evaluation of the individual matchlines.

9. The device according to claim 6, further comprising a controller connected to the individual matchlines, the precharge reference matchline, and the evaluation reference matchline,
the controller determines when a precharging operation of the individual matchlines is completed based upon a precharging operation being completed within the precharge reference matchline, and
the controller determines when an evaluation operation of the individual matchlines is completed based upon an evaluation operation being completed within the evaluation reference matchline.

10. The device according to claim 6, the time to precharge the precharge reference matchline and the time to evaluate the evaluation reference matchline are not fixed times and are variable times based upon processing conditions including voltage, temperature, material make up of the device, size of the device, and resistance of the device.

11. The device according to claim 6, further comprising searchlines intersecting the data rows, the searchlines evaluate search words by broadcasting the search words to the data rows.

12. The device according to claim 6, each of the rows maintains a single one of the words of data.

13. A method comprising:
maintaining words of data in content-addressable memory cells arranged in rows, two of the rows are timing reference rows and the remainder of the rows are data rows maintaining the words of data, the data rows comprise individual matchlines, a first reference row of the reference rows comprises a precharge reference matchline, and a second reference row of the reference rows comprises an evaluation reference matchline;
determining timing for the individual matchlines to precharge based on a time to precharge the precharge reference matchline, where the precharge reference matchline is hardwired to match all bits; and
determining timing for the individual matchlines to evaluate a search word based on a time for the evaluation reference matchline to evaluate the search word, where the evaluation reference matchline is hardwired to a one-bit-miss word that has only one bit not producing a match.

14. The method according to claim 13, the determining timing for the individual matchlines to precharge comprises determining when a precharging operation of the individual matchlines is completed based upon a precharging operation being completed within the precharge reference matchline, using a controller connected to the individual matchlines, the precharge reference matchline, and the evaluation reference matchline; and
the determining timing for the individual matchlines to evaluate a search word comprises determining when an evaluation operation of the individual matchlines is completed based upon an evaluation operation being completed within the evaluation reference matchline, using the controller.

15. The method according to claim 13, the time to precharge the precharge reference matchline and the time to evaluate the evaluation reference matchline are not fixed times and are variable times based upon processing conditions including voltage, temperature, material make up of the content-addressable memory cells, size of the content-addressable memory cells, and resistance of the content-addressable memory cells.

16. The method according to claim 13, evaluating the search word comprises broadcasting the search words to the data rows using searchlines intersecting the data rows.

* * * * *